(12) United States Patent
Liu et al.

(10) Patent No.: US 10,312,311 B2
(45) Date of Patent: Jun. 4, 2019

(54) THIN FILM TRANSISTOR, FABRICATION METHOD THEREOF, ARRAY SUBSTRATE, AND DISPLAY DEVICE

(71) Applicant: BOE TECHNOLOGY GROUP CO., LTD, Beijing (CN)

(72) Inventors: Zheng Liu, Beijing (CN); Xiaolong Li, Beijing (CN); Lujiang Huang Fu, Beijing (CN)

(73) Assignee: BOE TECHNOLOGY GROUP CO., LTD, Beijing (CN)

( * ) Notice: Subject to any disclaimer, the term of this patent is extended or adjusted under 35 U.S.C. 154(b) by 0 days.

(21) Appl. No.: 15/519,313

(22) PCT Filed: Nov. 8, 2016

(86) PCT No.: PCT/CN2016/105065
§ 371 (c)(1),
(2) Date: Apr. 14, 2017

(87) PCT Pub. No.: WO2017/152644
PCT Pub. Date: Sep. 14, 2017

(65) Prior Publication Data
US 2018/0138254 A1 May 17, 2018

(30) Foreign Application Priority Data
Mar. 11, 2016 (CN) .......................... 2016 1 0140453

(51) Int. Cl.
*H01L 27/32* (2006.01)
*G02F 1/1368* (2006.01)
(Continued)

(52) U.S. Cl.
CPC ........ *H01L 27/3262* (2013.01); *G02F 1/1368* (2013.01); *H01L 21/02532* (2013.01);
(Continued)

(58) Field of Classification Search
None
See application file for complete search history.

(56) References Cited

U.S. PATENT DOCUMENTS 5,567,958 A 10/1996 Orlowski et al.
2007/0170431 A1* 7/2007 Choi ................. G02F 1/136227
257/66
(Continued)

FOREIGN PATENT DOCUMENTS

CN 102782822 A 11/2012
CN 105655407 A 6/2016
(Continued)

OTHER PUBLICATIONS

State Intellectual Property Office of the P.R.C (SIPO) Office Action 1 for 201610140453.3 dated Feb. 2, 2018 16 Pages.
(Continued)

*Primary Examiner* — Michelle Mandala
(74) *Attorney, Agent, or Firm* — Anova Law Group, PLLC (57) ABSTRACT

The disclosed subject matter provides a thin film transistor and a fabricating method thereof. The thin film transistor includes a substrate, a source electrode and a drain electrode on the substrate, an active layer on the source and drain electrodes, a gate insulating layer on the active layer, and a gate electrode on the gate insulating layer. The active layer extends from the source electrode towards the drain electrode along a non-linear path.

20 Claims, 4 Drawing Sheets

(51) Int. Cl.
*H01L 29/66* (2006.01)
*H01L 29/786* (2006.01)
*H01L 27/12* (2006.01)
*H01L 21/02* (2006.01)
*H01L 21/265* (2006.01)
*H01L 21/266* (2006.01)
*H01L 21/311* (2006.01)
*H01L 29/423* (2006.01)

(52) U.S. Cl.
CPC ...... *H01L 21/02595* (2013.01); *H01L 21/266* (2013.01); *H01L 21/26513* (2013.01); *H01L 21/31111* (2013.01); *H01L 21/31133* (2013.01); *H01L 27/1248* (2013.01); *H01L 27/3248* (2013.01); *H01L 27/3258* (2013.01); *H01L 29/42384* (2013.01); *H01L 29/66757* (2013.01); *H01L 29/78636* (2013.01); *H01L 29/78642* (2013.01); *H01L 29/78675* (2013.01); *H01L 29/78696* (2013.01); *G02F 2001/13685* (2013.01); *G02F 2202/104* (2013.01); *H01L 27/127* (2013.01); *H01L 27/1222* (2013.01); *H01L 2227/323* (2013.01)

(56) References Cited

U.S. PATENT DOCUMENTS

| 2008/0001177 | A1* | 1/2008 | Kim | G02F 1/136286 |
| | | | | 257/213 |
| 2013/0187151 | A1* | 7/2013 | Yamazaki | H01L 29/786 |
| | | | | 257/43 |
| 2016/0043233 | A1 | 2/2016 | Ku et al. | |
| 2016/0155753 | A1* | 6/2016 | Kano | H01L 27/124 |
| | | | | 257/72 |

FOREIGN PATENT DOCUMENTS

JP    H06216390 A    8/1994
JP    2003273364 A    9/2003

OTHER PUBLICATIONS

The World Intellectual Property Organization (WIPO) International Search Report and Written Opinion for PCT/CN2016/105065 dated Jan. 12, 2017 14 Pages.

* cited by examiner

THIN FILM TRANSISTOR, FABRICATION METHOD THEREOF, ARRAY SUBSTRATE, AND DISPLAY DEVICE

CROSS-REFERENCES TO RELATED APPLICATIONS

This application is a national phase entry under 35 U.S.C. § 371 of International Application No. PCT/CN2016/105065, filed on Nov. 8, 2016, which claims priority of Chinese Patent Application No. CN201610140453.3, filed on Mar. 11, 2016. The above enumerated patent applications are incorporated by reference herein in their entirety.

TECHNICAL FIELD

The present disclosure generally relates to the display technologies and, more particularly, relates to a thin film transistor, a fabrication method thereof, a related array substrate, and a display device incorporating the array substrate.

BACKGROUND

Low temperature polysilicon thin film transistor (LTPS-TFT) displays have many advantages such as high resolution, fast response, high brightness, and high aperture. Due to the use of low temperature polysilicon, such displays also have high electron mobility.

Figure 1:
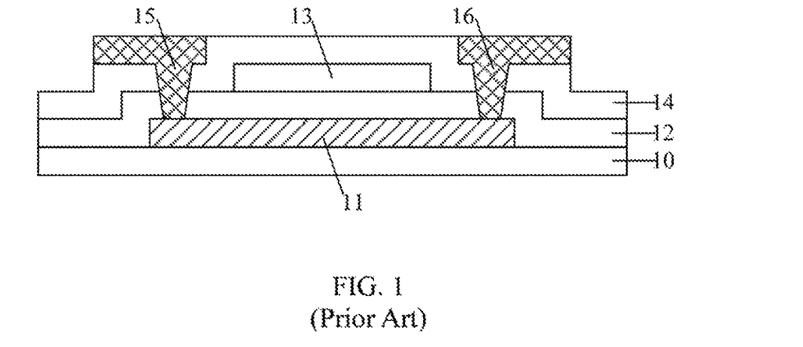
FIG. 1 illustrates a cross-sectional view of a conventional low temperature thin film transistor structure.

FIG. 1 illustrates a schematic view of a conventional low temperature polysilicon thin film transistor structure. As shown in FIG. 1 an existing low temperature polysilicon thin film transistor mas include a substrate 10, an active layer 11 placed on the substrate 10, a gate insulating layer 12 placed on the active layer 11, a gate electrode 13 placed on the gate insulating layer 12, an intermediate insulating layer 14 placed on the gate electrode 13, and a source electrode 15 and a drain electrode 16 placed on the intermediate insulating layer 14. The source electrode 15 and the drain electrode 16 may be electrically connected to the active layer 11 by through-holes penetrating the intermediate insulating layer 14 and the gate insulating layer 12. Such structure may be formed in four steps of a patterning process.

For thin film transistors, the channel length is a critical parameter. Especially for driver thin film transistors of organic electroluminescent diode displays, the channel length needs to be as long as tens of micrometers. Thus, the size of conventional low temperature polysilicon thin film transistors may be too large to implement high resolution displays.

BRIEF SUMMARY

Directed to solve one or more problems set forth above and other problems in the art, the present disclosure provides an array substrate, a fabrication method, a display panel and a display device.

One aspect of the present disclosure includes a thin film transistor. The thin film transistor includes: a substrate, a source electrode and a drain electrode on the substrate, and an active layer on the source electrode and the drain electrode. The active layer extends irons the source electrode towards the drain electrode along a non-linear path.

In some embodiments, the thin film translator further comprises: a gate insulating layer on the active layer; and a gate electrode on the gate insulating layer.

In some embodiments, the thin film transistor further comprises: an intermediate insulating layer on one side of the active layer facing toward the substrate, wherein the intermediate insulating layer includes a hollowed region that is corresponding to a region between the source electrode and the drain electrode.

In some embodiments, the source electrode and the drain electrode are on one side of the active layer facing toward the substrate; the intermediate insulating layer is between the active layer and the source electrode as well as the drain electrode; and the gate insulating layer and the gate electrode are on another side of the active layer facing away from the substrate.

In some embodiments, the intermediate insulating layer is made of inorganic materials; and a thickness of the intermediate insulating layer is between 2000 Å and 8000 Å.

In some embodiments, the intermediate insulating layer is made of organic materials; and a thickness of the intermediate insulating layer is between 10000 Å and 20000 Å.

In some embodiments, the intermediate insulating layer has a multi-layer structure formed by stacking organic materials and inorganic materials; and a thickness of the intermediate insulating layer is between 2000 Å and 20000 Å.

In some embodiments, slope angles of the intermediate insulating layer in the hollowed region are between approximately 30° and 60°.

In some embodiments, the active layer has an approximate M shape.

In some embodiments, the gate electrode has an approximate V shape or an approximate U shape.

Another aspect of the present disclosure provides an array substrate, comprising: the disclosed thin film transistor; and a first electrode electrically connected to the drain electrode of the thin film transistor.

In some embodiments, the first electrode is a pixel electrode.

In some embodiments, the array substrate further comprises: a top electrode; and an organic material layer between the top electrode and the first electrode.

Another aspect, of the present disclosure provides a display device, comprising the disclosed array substrate.

Another aspect of the present disclosure provides a method for fabricating a thin film transistor, comprising: providing a substrate; forming a source electrode and a drain electrode on the substrate; forming a polysilicon layer between the source electrode and the drain electrode; forming a gate insulating layer on the polysilicon layer; forming a gate electrode on the gate insulating layer; and using the gate electrode as a mask, implanting ions into the layer to form an active layer including a source region, a drain electrode region, and a channel region that is not subject to the ion implantation. The active layer extends from the source electrode towards the drain electrode along a non-linear path.

In some embodiments, the fabrication method further comprises: forming an intermediate insulating layer on the source electrode and the drain electrode before forming the active layer; and etching a portion of the intermediate insulating layer to form a hollowed region between the source electrode and the drain electrode.

In some embodiments, the intermediate insulating layer is made of inorganic materials; and a thickness of the intermediate insulating layer is between 2000 Å and 8000 Å.

In some embodiments, the intermediate insulating layer is made of organic materials; and a thickness of the intermediate insulating layer is between 10000 Å and 20000 Å.

In some embodiments, the intermediate insulating layer is made by stacking organic materials and inorganic materials to form a multi-layer structure; and a thickness of the intermediate insulating layer is between 2000 Å and 20000 Å.

In some embodiments, the slope angles in the hollowed region of the intermediate insulating layer are between approximately 30° and 60°.

In some embodiments, the active layer is formed in an approximate M shape; and the gate electrode if formed in an approximate V shape or an approximate U shape.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts. It should be understood that the exemplary embodiments described herein are only intended to illustrate and explain the present invention and not to limit the present invention. Other applications, advantages alternations, modifications, or equivalents to the disclosed embodiments are obvious to those skilled in the art and are intended to be encompassed within the scope of the present disclosure.

The disclosed subject matter provides an improved high-performance low-temperature array substrate and a fabricating method thereof. Embodiments of the present disclosure make structure adjustments to a source/drain electrode layer, an intermediate insulating layer and an active layer without increasing the number of masks and the process complexity.

In some embodiments, the disclosed improved high-performance low-temperature array substrate can be a polysilicon array substrate, an amorphous silicon (a-si) array substrate, or any other suitable array substrate. Similarly, the disclosed fabricating method can be used for forming an improved high-performance low-temperature polysilicon array substrate, an improved high-performance low-temperature a-si array substrate, or an improved high-performance low-temperature general array substrate. In the following description, the polysilicon array substrate is used as an example for explain the details of the disclosed subject matter.

In some embodiments of the present disclosure, the high-performance low-temperature array substrate has a polysilicon channel arranged in both horizontal and vertical directions. In some embodiments, the formation of the active layer has an approximate M shape, while the formation of the gate electrode layer has an approximate V shape. As such, the improved high-performance low-temperature array substrate may have a reduced area while the thin film transistor channel length remains the same. Therefore, the high-performance low-temperature array substrate can satisfy the high resolution display panel design requirements. Meanwhile, the disclosed fabricating method for forming the high-performance low-temperature array substrate does not increase the processing complexity comparing to existing fabricating methods.

Figure 2:
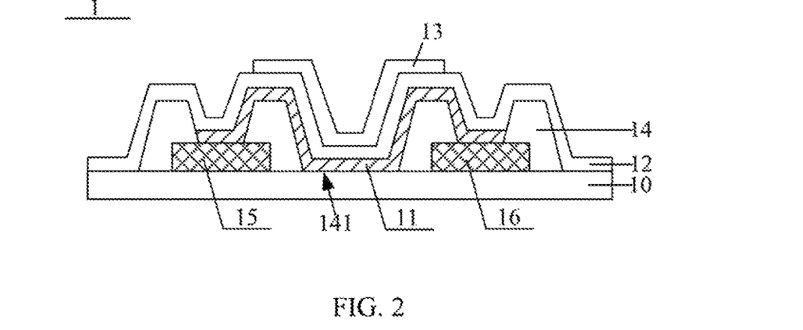
FIG. 2 illustrates a cross-sectional view of an exemplary thin film transistor structure according to the disclosed embodiments.
Figure 3:
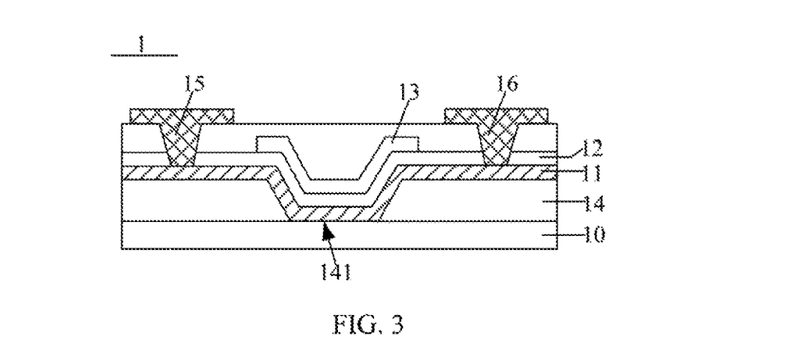
FIG. 3 illustrates a cross-sectional view of another exemplary thin film transistor structure according to the disclosed embodiments.

One aspect of the disclosed subject matter provides a thin film transistor. Referring to FIGS. 2 and 3, a cross-sectional view of an exemplary thin film transistor structure according to embodiments of the present disclosure is shown in FIG. 2. A cross-sectional view of another exemplary thin film transistor structure according to embodiments of the present disclosure is shown in FIG. 3.

As shown in FIGS. 2-3, the thin film transistor may include a substrate 10, a source electrode 15 and a drain electrode 16 configured on the substrate 10, an active layer 11, a gate insulating layer 12, and a gate electrode 13. A length of the active layer 11 located between the source electrode 15 and the drain electrode 16 may be longer than the linear distance between the source electrode 15 and the drain electrode 16.

The active layer 11 may be made of polysilicon. In order to improve the electrical ohmic contacts between the source electrode 15 and the active layer 11, as well as the electrical ohmic contacts between the drain electrode 16 and the active layer 11, the active layer 11 may be doped appropriately as n-type or p-type. That is, the active layer 11 may include a doped source electrode region and a doped drain region corresponding to the source electrode 15 and the drain electrode 16, respectively. In addition, the active layer 11 may also include a channel region between the source electrode region and the drain electrode region.

In order to increase the length of the active layer 11 located between the source electrode 15 and the drain electrode 16 without increasing the linear distance between the source electrode 15 and the drain electrode 16, the active layer 11 may have a changing height profile with respect to the substrate 10 between the source electrode 15 and the drain electrode 16. In addition, certain, graphical patterns may be configured under the active layer 11 between the source electrode 15 and the drain electrode 16 to control the height profile.

It should be understood by those skilled in the art that the actual length of the active layer 11 between the source electrode 15 and the drain electrode 16 is the channel length.

Further, the thin film transistor 1 according to the present disclosure may be any type of thin film transistors, such as a bottom gate type, a top gate, type, a double gate type, or any other appropriate structures.

The present invention provides a thin film transistor 1. By making the actual length of the active layer 11 located between the source electrode 15 and the drain electrode 16 longer than the linear distance between the source electrode 15 and the drain electrode 16, the thin film transistor 1 may be assured to have a desired channel length as well as a reduced thin film transistor size. In addition, when the linear distance between the source electrode 15 and the drain electrode 16 remains the same, the channel length may be increased to adapt to certain thin film transistors that requires a longer channel length.

In one embodiment, as shown in FIGS. 2-3, the thin film transistor 1 may include an intermediate insulating layer 14. The intermediate insulating layer 14 may be configured on one side of the active layer 11 facing toward the substrate 10. The intermediate insulating layer 14 may have a certain region which is hollowed and corresponds to the region between the source electrode 15 and the drain electrode 16.

The hollowed region 141 may be formed by etching the region of the intermediate insulating layer 14 corresponding to the region between the source electrode 15 and the drain electrode 16. As a result, the active layer 11 may become an M-shaped structure. That is, the height profile of the active layer 11 may change between the source electrode 15 and the drain electrode 16 and the active layer 11 may have an actual length greater than the width of the hollowed region 141.

It should be noted that, the term of "M-shaped" used herein is for the convenience of explanation. In some embodiments, an M-shaped structure may not look exactly like an M. For example, the M-shaped structure may have a single flat bottom.

In one embodiment, the thin film transistor 1 may have an intermediate insulating layer 14 configured under the active layer 11. The intermediate insulating layer 14 may include a hollowed region. As such, when the active layer 11 is formed, the active layer 11 may be formed in an M shape. When the size of the thin film transistor remains the same, the thin transistor 1 may have a longer channel length. Alternatively, when the channel length remains the same, the thin film transistor 1 may have a smaller size and a simpler structure.

In one embodiment, as shown in FIG. 2, the source electrode 15 and the drain electrode 16 may be configured on the side of the active layer 11 facing toward the substrate 10. The intermediate insulating layer 14 may be configured under the active layer 11 between the source electrode 15 and the drain electrode 16. The gate insulating layer 12 and the gate electrode 13 may be configured on the side of the active layer 11 facing away from the substrate 10.

When the active layer 11 is formed in an approximate M shape, the gate electrode 13 may be formed in an approximate V shape.

Similarly, the term of "V shape" used herein is for the convenience of explanation. The V shape may not look exactly like a V. For example, the V shape may have a flat bottom and may turn into an approximate U shape.

The thin film transistor 1 may be formed in four steps of the patterning process. Specifically, a source electrode 15 and a drain electrode 16 may be formed in a first step of the patterning process. An intermediate insulating layer 14 may be formed in a second step of the patterning process. An active layer 11 may be formed in a third step of the patterning process. A gate electrode 13 may be formed in a fourth step of the patterning process. Thus, the thin film transistor 1 may be formed without adding more times of patterning processing or increasing the processing complexity.

In one embodiment, the intermediate insulating layer 14 may have a thickness of approximately 2000 Å to 20000 Å.

The intermediate insulating layer 14 may be made of one or more inorganic materials, such as, silicon nitride and/or silicon oxide. When the intermediate insulating layer 14 is made of silicon nitride or silicon oxide, the intermediate insulating layer 14 may only include a single layer of silicon nitride or silicon oxide. When the intermediate insulating layer 14 is made of silicon nitride and silicon oxide, the intermediate insulating layer 14 may include a layer of silicon nitride and a layer of silicon oxide. In this case, the intermediate insulating layer 14 may have a thickness of approximately 2000 Å to 8000 Å.

The intermediate insulating layer 14 may be made of one or more organic materials, such as acrylic, polyimide or other organic materials. In this case, the intermediate insulating layer 14 may have a thickness of approximately 10000 Å to 20000 Å.

Alternatively, the intermediate insulating layer 14 may be laminated using one or more inorganic materials and one or more organic materials. In this case, the intermediate insulating layer 14 may have a thickness of approximately 6000 Å to 20000 Å.

In one embodiment, by configuring the thickness of the intermediate insulating layer 14, the thin film transistor 1 may satisfy the channel length requirement for different thin film transistor size requirements.

In one embodiment, in the hollowed region 141 of the intermediate insulating layer 14, the intermediate insulating layer 14 may maintain a slope angle between approximately 30° and 60°. That is, the sidewalls of the hollowed region 141 may maintain a slope angle between approximately 30° and 60°.

In this case, film cracking problems due to steep slope angles of the sidewalls in the hollowed region 141 of the intermediate insulating layer 14 in the subsequent process may be avoided.

In other embodiments, the present invention also provides an array substrate. The array substrate may include a plurality of pixel units. Each pixel unit may include a thin film transistor 1 and a first electrode that is electrically connected to the drain electrode 16 of the thin film transistor 1.

Figure 4:
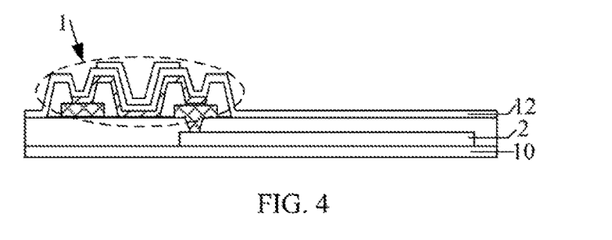
FIG. 4 illustrates a cross-sectional view of an exemplary array substrate according to the disclosed embodiments.

Referring to FIG. 4, a cross-sectional view of an exemplary array substrate is illustrated according to some embodiments. Specifically, as shown in FIG. 4, when the array substrate is a liquid crystal display (LCD) array substrate, the first electrode may be the pixel electrode 2.

Figure 5:
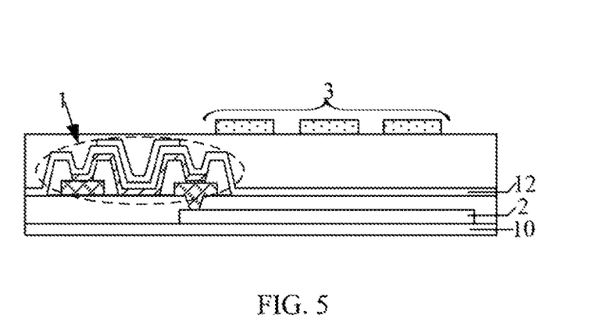
FIG. 5 illustrates a cross-sectional view of another exemplary array substrate according to the disclosed embodiments.
Figure 6:
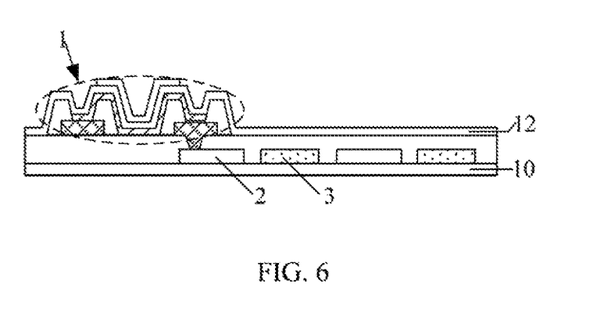
FIG. 6 illustrates a cross-sectional view of another exemplary array substrate according to the disclosed embodiments.

Referring to FIGS. 5 and 6, a cross-sectional view of another exemplary array substrate is illustrated according to some other embodiments. As shown in FIGS. 5-6, the array substrate may also include a plurality of common electrodes 3. In this case, as shown in FIG. 5, in an advanced super dimension switch (ADS) array substrate, the pixel electrode 2 and the common electrodes 3 may be disposed in different layers. The top electrodes may be stripe-shaped electrodes. The bottom electrode may be a plate-shaped electrode. Alternatively, as shown in FIG. 6, in an in-plane switching (IPS) array substrate, the pixel electrodes 2 and the common electrodes 3 may be configured alternately and coplanar with one another. The pixel electrodes 2 and the common electrodes 3 may be stripe-shaped electrodes.

Figure 7:
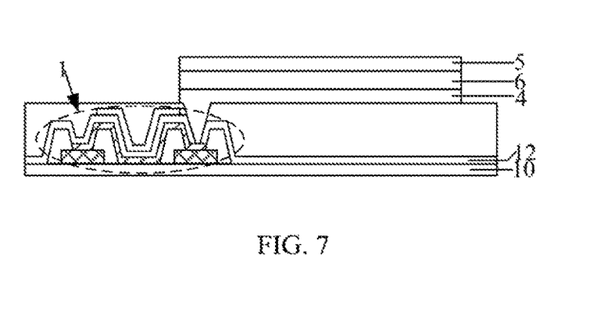
FIG. 7 illustrates a cross-sectional view of another exemplary array substrate according to the disclosed embodiments.

When the array substrate is an organic light emitting diode (OLED) display array substrate, the first electrode may be a bottom electrode. In this case, the array substrate may also include a top electrode and a functional organic material layer located between the top and bottom electrodes.

Referring to FIG. 7, a cross-sectional view of another exemplary array substrate is illustrated according to some embodiments. Specifically, as shown in FIG. 7, in an upright type organic light emitting diode display array substrate, the bottom electrode may be an anode 4, and the top electrode may be a cathode 5. The organic material layer 6 may be disposed between the anode 4 and the cathode 5. In an inverted organic light emitting diode display array substrate, the bottom electrode may be a cathode 5, and the top electrode may be an anode 4. The organic material layer 6 may be disposed between the cathode 5 and the anode 4.

In one embodiment, the organic material layer 6 may at least include a light emitting layer. Further, the organic material layer 6 may also include an electron transport layer and a hole transport layer disposed on both sides of the light emitting layer. In addition, in order to increase the injection efficiency of electrons and holes in the light emitting layer, the organic material layer 6 may also include an electron injection layer configured between the cathode 5 and the electron transport layer, and a hole injection layer configured between the hole transport layer and the anode 4.

Specifically, depending on the materials used for the anode 4 and the cathode 5, the array substrate may be divided into a single-sided light emitting type and a double-sided light emitting type. That is, when only one of the anode 4 and the cathode 5 is made of transparent material, the array substrate may be the single-sided light emitting type. When both the anode 4 and the cathode 5 are made of transparent material, the array substrate may be the double-sided light emitting type.

Depending on the materials used for the anode 4 and the cathode 5, the single-sided light emitting type array substrates may be further classified as an upper light emitting type and a lower light emitting type. Specifically, when the anode 4 is disposed close to the substrate 10 and the cathode 5 is disposed away from the substrate 10, and the anode 4 is made of transparent conductive material and the cathode 5 is made of opaque or non-transparent conductive material, the light may emit from the anode 4 and pass through the substrate 10. In this case, the array substrate may be classified as the lower light emitting type. When the anode 4 is disposed close to the substrate 10 and the cathode 5 is disposed away from the substrate 10, and the anode 4 is made of opaque or non-transparent conductive material and the cathode 5 is made of transparent conductive material, the light may emit from the cathode 5. In this case, the array substrate may be classified as the top light emitting type. In some other embodiments, the relative positions of the anode 4 and the cathode 5 may be reversed.

Accordingly, in the disclosed array substrate provided by the present invention, by making the actual length of the active layer 11 located between the source electrode 15 and the drain electrode 16 being longer than the linear distance between the source electrode 15 and the drain electrode 16, the array substrate may be able to have a desired channel length as well as a reduced thin film transistor size. Thus, the array substrate may improve the resolution of display devices incorporating the array substrate. In addition, when incorporated in OLED displays, the array substrate may avoid increasing the thin film transistor size due to the requirement for increased channel length.

Figure 9:
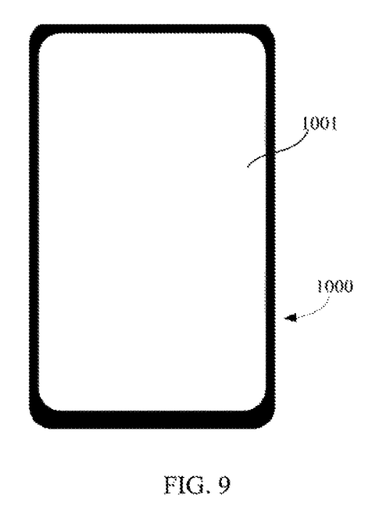
FIG. 9 illustrates a schematic view of an exemplary display device according to the disclosed embodiments.

Another aspect of the disclosed subject matter provides a display device incorporating the disclosed array substrate. Referring to FIG. 9, a schematic view of an exemplary display device is illustrated according to some embodiments. As shown in FIG. 9, a display device 1000 may incorporate an array substrate 1001 described above.

Specifically, the display device 1000 may be a LCD television, a laptop computer, a tablet computer, or a smart phone, etc. The display device 1000 may also be an OLED television.

The present invention also provides a method for fabricating the thin film transistors described above. Referring to FIGS. 2-3, the fabrication method may include forming a source electrode 15, a drain electrode 16, an active layer 11, a gate insulating layer 12, and a gate electrode 13 on the substrate 10. The actual length of the active layer 11 located between the source electrode 15 and the drain electrode 16 may be longer than the linear distance between the source electrode 15 and the drain electrode 16.

In one embodiment, before the active layer 11 is formed, a polysilicon layer may be formed. Then the regions of the polysilicon layer corresponding to the source electrode 15 and the drain electrode 16 may be doped with n-type dopant or p-type dopant to form the active layer 11.

In order to increase the length of the active layer 11 located between the source electrode 15 and the drain electrode 16 without increasing the linear distance between the source electrode 15 and the drain electrode 16, the active layer 15 may have a changing height profile with respect to the substrate 10 between the source electrode 15 and the drain electrode 16. In addition, certain patterns may be configured under the active layer 11 between the source electrode 15 and the drain electrode 16 to control the height profile.

Accordingly, in the disclosed method for fabricating the thin film transistor 1, by making the actual length of the active layer 11 located between the source electrode 15 and the drain electrode 16 being longer than the linear distance between the source electrode 15 and the drain electrode 16, the fabrication method may achieve a desired channel length as well as a reduced thin film transistor size. In addition, when the linear distance between the source electrode 15 and the drain electrode 16 remains the same, the fabrication method may increase the channel length to satisfy certain thin film transistor requirements that require a longer channel length.

In some embodiments, as shown in FIGS. 2-3, before the active layer 11 is formed, the fabrication method may also include forming an intermediate insulating layer 14. A portion of the intermediate insulating layer 14 corresponding to the region between the source electrode 15 and the drain electrode 16 may be etched to form a hollowed region 141.

That is, both ends of the active layer 11 may be raised while the middle portion of the active layer 11 may be formed in the hollowed region 141 corresponding to the region between the source electrode 15 and the drain electrode 16. As such, the active layer 11 may be formed in an approximate M shape. Thus, the active layer 11 may have an actual length greater than the width of the hollowed region 141.

In certain embodiments, the fabrication method may include forming an intermediate insulating layer 14 under the active layer 11 and etching a portion of the intermediate insulating layer 14 to form a hollowed region 141. As such, when the active layer 11 is formed, the active layer 11 may be formed in an approximate M shape. When the size of the thin film transistor remains the same, the fabrication method may form a longer channel length. Alternatively, when the channel length remains the same, the fabrication method may form a thin film transistor having a smaller size and a simpler structure.

Figure 8A:
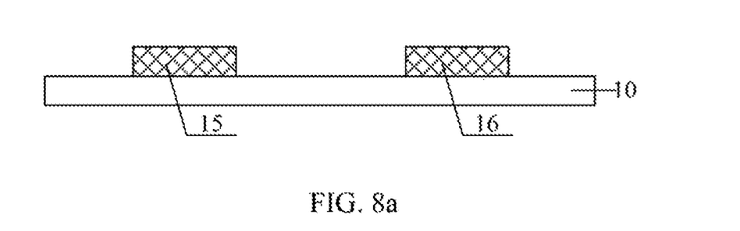
FIGS. 8a-8c illustrate certain fabrication steps for an exemplary thin film transistor according to the disclosed embodiments.
Figure 8B:
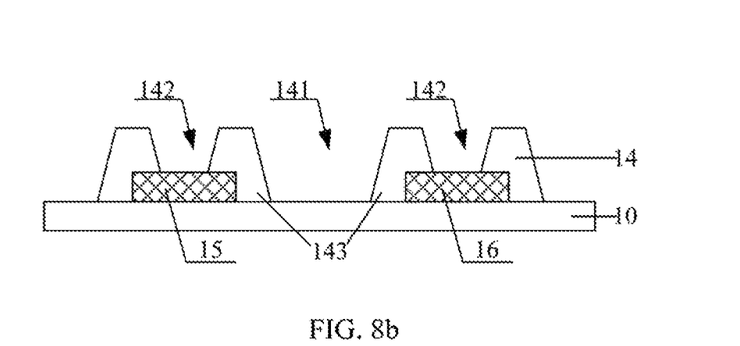
Figure 8C:
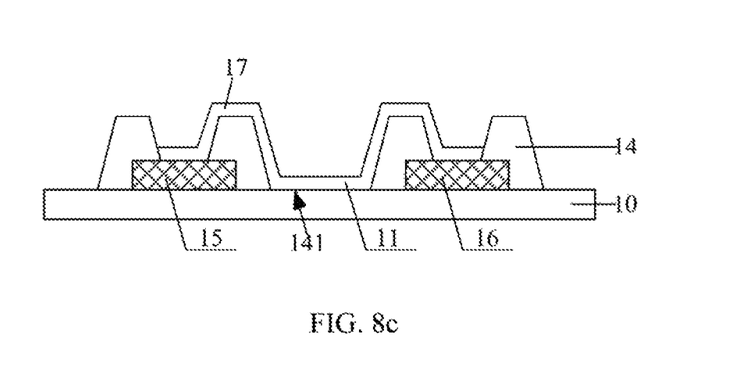
Figure 10:
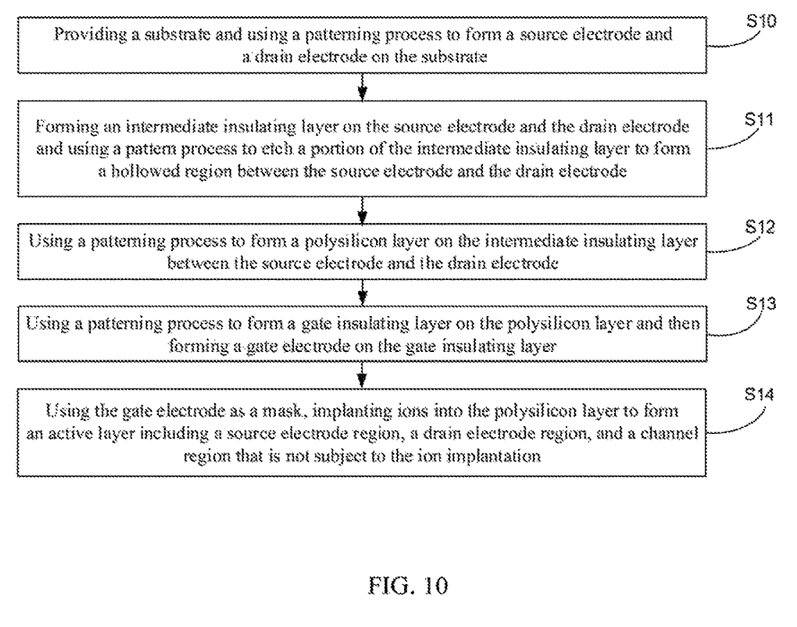
FIG. 10 illustrates a flow chart of an exemplary method for fabricating a thin film transistor according to the disclosed embodiments.

Referring to FIGS. 8a-8c, certain fabrication steps for an exemplary thin film transistor are illustrated according to the present disclosure. FIG. 10 illustrates a flow chart of the fabrication method for an exemplary thin film transistor according to the present disclosure. As shown in FIG. 10, the fabrication method for the thin film transistor 1 previously described may include the following steps.

Step S10: providing a substrate and using a patterning process to form a source electrode and a drain electrode on the substrate.

As shown in FIG. 8a, a source electrode 15 and a drain electrode 16 may be formed on a substrate 10 by using a single patterning process. In one embodiment, the source electrode 15 and the drain electrode 16 may be a single-layer structure, a double-layer structure or a multi-layer structure. The source electrode 15 and the drain electrode 16 may be made of metal, or metal alloy, such as molybdenum, aluminum, tungsten molybdenum alloy, etc. The source electrode 15 and the drain electrode 16 may have a thickness of approximately 1000 Å to 5000 Å. Preferably, the source electrode 15 and the drain electrode 16 may have a thickness of approximately 1500 Å to 4000 Å.

Specifically, a sputtering process, a plasma enhanced chemical vapor deposition (PECVD) process, a low pressure chemical vapor deposition (LPCVD) process, an atmospheric pressure chemical vapor deposition (APCVD) process, or an electron cyclotron resonance chemical vapor deposition (ECR-CVD) process may be used to form a source and drain metal film on the substrate 10. Then, a lithographic etching process may be used to form the source electrode 15 and the drain electrode 16.

In some embodiments, the substrate 10 may be a pre-washed transparent substrate such as glass.

Step S11: forming an intermediate insulating layer on the source electrode and the drain electrode and using a patterning process to etch a portion of the intermediate insulating layer to form a hollowed region between the source electrode and the drain electrode.

As shown in FIG. 8b, through a single patterning process, an intermediate insulating layer 14 may be formed on the substrate 10 with the source electrode 15 and the drain electrode 16. The intermediate insulating layer 14 may be a single-layer structure, a double-layer structure or a multi-layer structure, having a thickness of approximately 2000 Å to 20000 Å.

The intermediate insulating layer 14 may be made of one or more inorganic materials, such as silicon oxide or silicon nitride, etc. In this case, the intermediate insulating layer 14 may have a thickness of approximately 2000 Å to 8000 Å. The intermediate insulating layer 14 may also be made of one or more organic materials, such as acrylic, polyimide, or other organic materials. In this case, the intermediate insulating layer 14 may have a thickness of approximately 10000 Å to 20000 Å. Alternatively, the intermediate insulating layer 14 may be laminated using one or more inorganic materials and one or more organic materials. In this case, the intermediate insulating layer 14 may have a thickness of approximately 6000 Å to 20000 Å.

Specifically, a plasma enhanced chemical vapor deposition (PECVD) process, a low pressure chemical vapor deposition (LPCVD) process, an atmospheric pressure chemical vapor deposition (ECR-CVD) process, or an electron cyclotron resonance chemical vapor deposition (ECR-CVD) process may be used to form an insulating film on the substrate 10. Then, a lithographic etching process may be used to form the intermediate insulating layer 14.

Referring to FIG. 8b, in addition to the hollowed region 141, the intermediate insulating layer 14 may also include through-holes 142 subsequently formed to electrically connect the active layer 11 to the source electrode 15 and the drain electrode 16.

In one embodiment, in order to avoid the film cracking problems in the subsequent process, the slope angles 143 of the sidewalls in the hollowed region 141 of the intermediate insulating layer 14 may be controlled as small as possible, for example, between 30° and 60°.

Step S12: using a patterning process to form a polysilicon layer on the intermediate insulating layer between the source electrode and the drain electrode.

As shown in FIG. 8c, through a single patterning process, a polysilicon layer 17 may be formed on the intermediate insulating layer 14. The polysilicon layer 17 may be electrically connected to the source electrode 15 and the drain electrode 16 through the through-holes 142 in the intermediate insulating layer 14. Due to the existence of the hollowed region 141 in the intermediate insulating layer 14, the polysilicon layer 17 may be formed in an approximate M shape.

In one embodiment, the polysilicon layer 17 may have a thickness of approximately 100 Å to 3000 Å. Preferably, the polysilicon layer 17 may have a thickness of approximately 500 Å to 1000 Å.

In one embodiment, a plasma enhanced chemical vapor deposition (PECVD) process, a low pressure chemical vapor deposition (LPCVD) process, an atmospheric pressure chemical vapor deposition (APCVD) process, or an electron cyclotron resonance chemical vapor deposition (ECR-CVD) process may be used to form an amorphous silicon film on the intermediate insulating layer 14. Then, a lithographic etching process may be used to form an amorphous silicon layer in the active layer 11 region. Subsequently, the amorphous silicon layer may be baked in a high temperature oven to dehydrogenase to prevent hydrogen explosion occurrence during the crystallization process and to reduce interior defect state density hi the crystallized film.

After the dehydrogenation process is completed, a low temperature polysilicon (LTPS) process may be performed by using a laser annealing process (ELA), a metal induced crystallization (MIC) process, a solid phase crystallization (SPC) process, or other appropriate crystallization methods to crystallize the amorphous silicon layer to form the polysilicon layer 17.

In another embodiment, a crystallization process may be performed first on the amorphous silicon film to form a polysilicon film. Then, a lithographic etching process may he performed in the active layer region to form the polysilicon layer 17.

In some other embodiments, the fabrication method may not be limited to the low temperature polysilicon process. The lubrication method may be a high temperature polysilicon fabricating process, as long as the polysilicon layer 17 is properly formed.

In other embodiments, a plasma enhanced chemical vapor process (PECVD), a low pressure chemical vapor deposition (LPCVD) process, or a sputtering process may be used to form the polysilicon layer 17 directly on the intermediate insulating layer 14. In this case, the deposition temperature may be controlled under approximately 600° C.

Step S13: forming a gate insulating layer on the polysilicon layer and then using a patterning process to form a gate electrode on the gate insulating layer.

As shown in FIG. 2, a gate insulating layer 12 may be formed on the polysilicon layer 17, and then a gate electrode 13 may be formed on the gate insulating layer 12 by using a single patterning process. Because the polysilicon layer 17 has an approximate M shape, the gate electrode 13 may be formed in an approximate V shape.

The gate insulating layer 12 may be a single-layer structure, a double-layer structure, or a multi-layer structure. For example, the gate insulating layer 12 may be a single-layer silicon oxide structure, a single-layer silicon nitride structure, or a silicon oxide and silicon nitride laminated structure. The gate insulating layer 12 may have a thickness of approximately 500 Å to 2000 Å. Preferably, the gate insulating layer 12 may have a thickness of approximately 600 Å to 1500 Å.

The gate electrode 13 may be a single-layer structure, a double-layer structure, or a multi-layer structure. The gate electrode 13 may be made of metal or metal alloy, such as molybdenum, aluminum, or tungsten molybdenum alloy, etc. The gate electrode 13 may have a thickness of approximately 1000 Å to 5000 Å. Preferably, the gate electrode 13 may have a thickness of approximately 1500 Å to 4000 Å.

Specifically, a plasma enhanced chemical vapor deposition (PECVD) process, a low pressure chemical vapor deposition (LPCVD) process, an atmospheric pressure chemical vapor deposition (APCVD) process, or an electron cyclotron resonance chemical vapor deposition (ECR-CVD) process may be used to form a gate insulating layer 12 and a gate metal film. Then, a lithographic etching process may be used to form a gate electrode 13.

Step S14: using the gate electrode as a mask, implanting ions into the polysilicon layer to form an active layer including a source electrode region, a drain electrode region, and a channel region that is not subject to the ion implantation.

As shown in FIG. 2, the gate electrode 13 may be used as a mask during an ion implantation process for injecting ions into the polysilicon layer 17 to form an active layer 11. That is, an ion implantation process may be performed to inject ions into the regions of the polysilicon laser 17 corresponding to the source electrode 15 and the drain electrode 16 to form a source electrode region and a drain electrode region of the active layer 11. The portion of the polysilicon layer 17 without ion implantation may become a channel region. The channel region may be located between the source electrode region and the drain electrode region.

Specifically, the ion implantation process may be an ion implantation process with a mass analyzer, an ion cloud type Implantation process without a mass analyzer, a plasma ion implantation process, or a solid state diffusion type ion implantation process. The ion cloud type implantation process may be preferred. Depending on the process design, a mixed gas, such as $B_2H_6/H_2$ or $PH_3/H_2$, may be used for ion implantation. The ion implantation energy may be approximately 10 keV to 200 keV. Preferably, the ion implantation energy may be approximately 40 keV to 100 keV. The ion implantation dosage may be in the range of approximately $1\times10^{11}$ atoms/cm$^3$ to $1\times10^{20}$ atoms/cm$^3$. Preferably, the ion implantation dosage may be in the range of approximately $1\times10^{14}$ atoms/cm$^3$ to $1\times10^{18}$ atoms/cm$^3$.

Further, the ion implantation may be activated by a rapid thermal annealing process, a laser annealing process, or a furnace annealing process. The furnace annealing process may be more cost effective, simpler, and more consistent.

As shown in FIG. 2, the thin film transistor 1 may be formed in four steps of a patterning process S10 to S14. Compared to the conventional technology, the present invention may neither increase the number of steps of a patterning process nor increase the fabrication process complexity.

Various embodiments haw been described to illustrate the operation principles and exemplary implementations. The embodiments disclosed herein are exemplary only. Other applications, advantages, alternations, modifications, or equivalents to the disclosed embodiments are obvious to those skilled in the art and are intended to be encompassed within the scope of the present disclosure.

The labels used in the figures may include the following:
1—thin film transistor;
2—pixel electrode;
3—common electrode;
4—anode;
5—cathode;
6—functional organic material layer;
10—substrate;
11—active layer;
12—gate insulating layer;
13—gate electrode;
14—intermediate insulating layer;
141—hollow region;
142—through-hole;
15—source electrode;
16—drain electrode;
17—polysilicon layer;
1000—display device; and
1001—array substrate.

What is claimed is:
1. A thin film transistor, comprising:
a substrate;
a source electrode and a drain electrode on the substrate;
an active layer on the source electrode and the drain electrode, the active layer extending from the source electrode towards the drain electrode along a non-linear path; and
an intermediate insulating layer, a portion of the intermediate insulating layer being arranged on the source electrode and the drain electrode and forming a raised profile layer from the substrate;
wherein:
the non-linear path of the active layer includes a first portion and a second portion connecting the first portion, the second portion extending in a direction away from the substrate and along the raised profile of the portion of the intermediate insulating layer, and
the active layer along the first portion of the non-linear path contacts the source and drain electrodes, and the active layer along the second portion of the non-linear path contacts the intermediate insulating layer.
2. The thin film transistor of claim 1, further comprising:
a gate insulating layer on the active layer; and
a gate electrode on the gate insulating layer,
wherein the intermediate insulating layer is on one side of the active layer facing toward the substrate, and includes a hollowed region that corresponds to a region between the source electrode and the drain electrode.
3. The thin film transistor of claim 2, wherein:
the source electrode and the drain electrode are on one side of the active layer facing toward the substrate; and the gate insulating layer and the gate electrode are on another side of the active layer facing away from the substrate.

4. The thin film transistor of claim 2, wherein:
the intermediate insulating layer is made of inorganic materials; and
a thickness of the intermediate insulating layer is between 2000 Å and 8000 Å.

5. The thin film transistor of claim 2, wherein:
the intermediate insulating layer is made of organic materials; and
a thickness of the intermediate insulating layer is between 10000 Å and 20000 Å.

6. The thin film transistor of claim 2, wherein:
the intermediate insulating layer has a multi-layer structure formed by stacking organic materials and inorganic materials; and
a thickness of the intermediate insulating layer is between 2000 Å and 20000 Å.

7. The thin film transistor of claim 2, wherein:
slope angles of the intermediate insulating layer in the hollowed region are between 30° and 60°.

8. The thin film transistor of claim 1, wherein:
the active layer has an approximate M shape.

9. The thin film transistor of claim 2, wherein:
the gate electrode has an approximate V shape or an approximate U shape.

10. An array substrate, comprising:
the thin film transistor of claim 1; and
a first electrode electrically connected to the drain electrode of the thin film transistor.

11. The array substrate of claim 10, wherein the first electrode is a pixel electrode.

12. The array substrate of claim 10, further comprising:
a top electrode; and
an organic material layer between the top electrode and the first electrode.

13. A display device, comprising the array substrate of claim 10.

14. A method for fabricating a thin film transistor, comprising:
providing a substrate;
forming a source electrode and a drain electrode on the substrate;
forming an intermediate insulating layer, a portion of the intermediate insulating layer being arranged on the source electrode and the drain electrode and forming a raised profile away from the substrate;
forming a polysilicon layer between the source electrode and the drain electrode;
forming a gate insulating layer on the polysilicon layer;
forming a gate electrode on the gate insulating layer; and
using the gate electrode as a mask, implanting ions into the polysilicon layer to form an active layer including a source region, a drain electrode region, and a channel region that is not subject to the ion implantation;
wherein:
the active layer extends from the source electrode towards the drain electrode along a non-linear path,
the non-linear path of the active layer includes a first portion and a second portion connecting the first portion, the second portion extending towards the gate electrode and along the raised profile of the intermediate insulating layer, and
the active layer along the first portion of the non-linear path contacts the source and drain electrodes, and the active layer along the second portion of the non-linear path contacts the intermediate insulating layer.

15. The fabrication method of claim 14, further comprising:
etching a portion of the intermediate insulating layer to form a hollowed region between the source electrode and the drain electrode.

16. The fabrication method of claim 15, wherein:
the intermediate insulating layer is made of inorganic materials; and
a thickness of the intermediate insulating layer is between 2000 Å and 8000 Å.

17. The fabrication method of claim 15, wherein:
the intermediate insulating layer is made of organic materials; and
a thickness of the intermediate insulating layer is between 10000 Å and 20000 Å.

18. The fabrication method of claim 15, wherein:
the intermediate insulating layer is made by stacking organic materials and inorganic materials to form a multi-layer structure; and
a thickness of the intermediate insulating layer is between 2000 Å and 20000 Å.

19. The fabrication method of claim 15, wherein:
slope angles of the intermediate insulating layer in the hollowed region are between 30° and 60°.

20. The fabrication method of claim 15, wherein:
the active layer is formed in an M shape; and
the gate electrode if formed in a V shape or a U shape.

* * * * *